(12) United States Patent
Wang et al.

(10) Patent No.: US 7,176,144 B1
(45) Date of Patent: Feb. 13, 2007

(54) PLASMA DETEMPLATING AND SILANOL CAPPING OF POROUS DIELECTRIC FILMS

(75) Inventors: Feng Wang, Fremont, CA (US); Michelle T. Schulberg, Palo Alto, CA (US); Jianing Sun, San Jose, CA (US); Raashina Humayun, San Jose, CA (US); Patrick A. Van Cleemput, La Tronche (FR)

(73) Assignee: Novellus Systems, Inc., San Jose, CA (US)

( * ) Notice: Subject to any disclaimer, the term of this patent is extended or adjusted under 35 U.S.C. 154(b) by 15 days.

(21) Appl. No.: 10/785,235

(22) Filed: Feb. 23, 2004

Related U.S. Application Data (63) Continuation-in-part of application No. 10/404,693, filed on Mar. 31, 2003.

(51) Int. Cl.
*H01L 21/31* (2006.01)
*H01L 21/469* (2006.01)

(52) U.S. Cl. .................. 438/759; 438/778; 438/782; 438/783; 438/786; 257/E21.273

(58) Field of Classification Search ............. 438/759, 438/778, 782, 783, 786; 257/E21.273
See application file for complete search history.

(56) References Cited

U.S. PATENT DOCUMENTS

| | | | |
|---|---|---|---|
| 4,357,451 A | 11/1982 | McDaniel | |
| 4,882,008 A | 11/1989 | Garza et al. | |
| 4,885,262 A | 12/1989 | Ting et al. | |
| 5,504,042 A | 4/1996 | Cho et al. | |
| 5,686,054 A | 11/1997 | Barthel et al. | |
| 5,700,844 A * | 12/1997 | Hedrick et al. ............... 521/77 |
| 5,789,027 A * | 8/1998 | Watkins et al. ............ 427/250 |
| 5,849,640 A | 12/1998 | Hsia et al. | |
| 5,851,715 A | 12/1998 | Barthel et al. | |
| 5,858,457 A | 1/1999 | Brinker et al. | |
| 5,920,790 A | 7/1999 | Wetzel et al. | |
| 6,140,252 A | 10/2000 | Cho et al. | |
| 6,171,661 B1 | 1/2001 | Zheng et al. | |
| 6,177,329 B1 | 1/2001 | Pang | |

(Continued)

FOREIGN PATENT DOCUMENTS

WO WO95/07543 3/1995

OTHER PUBLICATIONS

Cho et al., "Plasma treatments of molecularly templated nanoporous silica films", Electrochemical and Solid State Letters, 4(4) G35-G38 (2001).*

(Continued)

*Primary Examiner*—Michelle Estrada
*Assistant Examiner*—Fernando L. Toledo
(74) *Attorney, Agent, or Firm*—Beyer Weaver & Thomas LLP (57) ABSTRACT

Methods of preparing a low-k dielectric material on a substrate are provided. The methods involve using plasma techniques to remove porogen from a precursor layer comprising porogen and a dielectric matrix and to protect the dielectric matrix with a silanol capping agent, resulting in a low-k dielectric matrix. Porogen removal and silanol capping can occur concurrently or sequentially. If performed sequentially, silanol capping is performed without first exposing the dielectric matrix to moisture or ambient conditions.

41 Claims, 5 Drawing Sheets

U.S. PATENT DOCUMENTS

| | | | |
|---|---|---|---|
| 6,232,658 B1 | 5/2001 | Catabay et al. | |
| 6,258,735 B1 | 7/2001 | Xia et al. | |
| 6,268,276 B1 | 7/2001 | Chan et al. | |
| 6,270,846 B1 | 8/2001 | Brinker et al. | |
| 6,271,273 B1 | 8/2001 | You et al. | |
| 6,312,793 B1 | 11/2001 | Grill et al. | |
| 6,329,017 B1 * | 12/2001 | Liu et al. | 427/240 |
| 6,329,062 B1 | 12/2001 | Gaynor | |
| 6,340,628 B1 | 1/2002 | Van Cleemput et al. | |
| 6,365,266 B1 | 4/2002 | MacDougall et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 * | 5/2002 | Gore et al. | 521/61 |
| 6,392,017 B1 | 5/2002 | Chandrashekar | |
| 6,420,441 B1 | 7/2002 | Allen et al. | |
| 6,444,715 B1 * | 9/2002 | Mukherjee et al. | 521/64 |
| 6,455,417 B1 | 9/2002 | Bao et al. | |
| 6,479,374 B1 | 11/2002 | Ioka et al. | |
| 6,500,770 B1 * | 12/2002 | Cheng et al. | 438/782 |
| 6,548,113 B1 | 4/2003 | Birnbaum et al. | |
| 6,573,030 B1 | 6/2003 | Fairbairn et al. | |
| 6,576,345 B1 | 6/2003 | Cleemput et al. | |
| 6,596,467 B2 | 7/2003 | Gallagher et al. | |
| 6,596,654 B1 | 7/2003 | Bayman et al. | |
| 6,610,362 B1 | 8/2003 | Towle | |
| 6,632,478 B2 | 10/2003 | Gaillard et al. | |
| 6,667,147 B2 | 12/2003 | Gallagher et al. | |
| 6,677,251 B1 | 1/2004 | Lu et al. | |
| 6,715,498 B1 | 4/2004 | Humayun et al. | |
| 6,756,085 B2 | 6/2004 | Waldfried et al. | |
| 6,797,643 B2 | 9/2004 | Rocha-Alvarez et al. | |
| 6,805,801 B1 | 10/2004 | Humayun et al. | |
| 6,812,043 B2 | 11/2004 | Bao et al. | |
| 6,815,373 B2 | 11/2004 | Singh et al. | |
| 6,831,284 B2 | 12/2004 | Demos et al. | |
| 6,846,380 B2 | 1/2005 | Dickinson et al. | |
| 6,848,458 B1 | 2/2005 | Shrinivasan et al. | |
| 6,849,549 B1 | 2/2005 | Chiou et al. | |
| 6,867,086 B1 | 3/2005 | Chen et al. | |
| 6,903,004 B1 | 6/2005 | Spencer et al. | |
| 6,914,014 B2 | 7/2005 | Li et al. | |
| 7,018,918 B2 | 3/2006 | Kloster et al. | |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0106500 A1 | 8/2002 | Albano et al. | |
| 2002/0123240 A1 * | 9/2002 | Gallagher et al. | 438/781 |
| 2002/0192980 A1 * | 12/2002 | Hogle et al. | 438/778 |
| 2003/0064607 A1 | 4/2003 | Leu et al. | |
| 2003/0119307 A1 | 6/2003 | Bekiaris et al. | |
| 2003/0157248 A1 * | 8/2003 | Watkins et al. | 427/256 |
| 2003/0198895 A1 | 10/2003 | Toma et al. | |
| 2004/0069410 A1 | 4/2004 | Moghadam et al. | |
| 2004/0096586 A1 | 5/2004 | Schulberg et al. | |
| 2004/0096593 A1 | 5/2004 | Lukas et al. | |
| 2004/0096672 A1 * | 5/2004 | Lukas et al. | 428/446 |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0161532 A1 | 8/2004 | Kloster et al. | |
| 2004/0170760 A1 | 9/2004 | Meagley et al. | |
| 2004/0185679 A1 | 9/2004 | Ott et al. | |
| 2005/0064698 A1 | 3/2005 | Chang et al. | |

OTHER PUBLICATIONS

Humayun et al., "Method For Forming Porous Films By Porogen Removal Combined With In Situ Modification", U.S. Appl. No. 10/404,693, filed Mar. 31, 2003, Office Action dated Mar. 15, 2005.

Humayun et al., "Method for Forming Porous Films By Porogen Removel Combined Wtih In SITU Surface Modification", Novellus Corporation, U.S. Appl. No. 10/404,693. filed Mar. 31. 2003, pp. 1-32.

Tipton et al., "Method Of Porogen Removal From Porous Low-K Films Using UV Radiation", Novellus Systems, Inc., U.S. Appl. No. 10/672,311, filed Sep. 26, 2003, pp. 1-27.

Jan, C.H., et al, *90NM Generation, 300mm Wafer Low k ILD/Cu Interconnect Technology*, 2003 IEEE Interconnect Technology Conference.

Wu et al., U.S. Appl. No. 10/789,103, entitled: Methods For Producing Low-K CDO Films With Low Residual Stress.

Wu et al., U.S. Appl. No. 10/820,525, entitled: Methods For Producing Low-K CDO Films With Low Residual Stress.

Wu et al., U.S. Appl. No. 10/800,409, entitled: Methods For Producing Low-K CDO Films.

U.S. Appl. No. 10/016,017, filed Dec.12, 2001.

U.S. Appl. No. 10/125,614, filed Apr. 18, 2002.

U.S. Appl. No. 10/202,987. filed Jul. 23. 2002.

Tipton et al., "Method for Removal of Porogens From Porous Low-K Films Using Supercritical Fluids", Novellus Systems, Inc., U.S. Appl. No. 10/672,305, filed Sep. 26. 2003. pp. 1-32.

Cho et al., "Method and Apparatus for UV Exposure of Low Dielectric Constant Materials for Porogen Removal and Improved Mechanical Properties", Novellus Systems, Inc., U.S. App. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311 filed Sep. 26, 2003, Office Action dated Dec. 28, 2004.

Bandyopadhyay et al., "Method to Improve Mechanical Strength of Low-K Dielectric Film Using Modulated UV Exposure", U.S. Appl. No. 10/825,888, filed Apr. 16, 2004.

R. D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-*k* Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured Al," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution for Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.

Fox et al., "Methods For Producing Low-Stress Carbon-Doped Oxide Films With Improved Integration Properties", U.S. Appl. No. 10/987,208, filed Nov. 12, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods For Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Aug. 24, 2005, from U.S. Appl. No. 10/404,693.

U.S. Office Action mailed Sep. 1, 2005, from U.S. Appl. No. 10/672,305.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed Feb. 7, 2006, from U.S. Appl. No. 10/672,305.

U.S. Office Action mailed Dec. 20, 2005, from U.S. Appl. No. 10/672,311.

U.S. Office Action mailed Dec. 20, 2005, from U.S. Appl. No. 10/849,568.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28. 2006, from U.S. Appl. No. 10/404,693.

U.S. Office Action mailed Mar. 29, 2006, from U.S. Appl. No. 10/800,377.

U.S. Office Action mailed May 31, 2006, from U.S. Appl. No. 10/941,502.

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelmam et al., "Method for Reducing Stress in Porous Dielectric Films", U.S. Appl. No. 11/369,311, filed Mar. 6, 2006.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Jun. 8. 2006. from U.S. Appl. No. 10/825,888.

Tipton et al., "Method For Removal Of Porogens From Porous Low-K Films Using Supercritical Fluids", U.S. Appl. No. 10/672,305, filed Sep. 26, 2003, Office Action dated Mar. 22, 2005.

Cho et al., "Plasma Treatments of Molecularly Templated Nanoporous Silica Films," Electrochemical and Solid-State Letters, 4 (4) G35-G38 (2001).

Justin F. Gaynor, "In-Situ Treatment of Low-K-Films With a Silylating Agent After Exposure To Oxidizing Environments," U.S. Appl. No. 10/056,926, filed Jan. 24, 2002, 34 Pages.

Gangpadhyay et al., "The First International Surface Cleaning Workshop," Northeastern University, Nov. 11-14, 2002.

Yung et al., "Spin-on Mesoporous Silica Films with Ultralow Dielectric Constants, Ordered Pore Structures, and Hydrophohic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013,. filed Nov. 21, 2002, 34 Pages.

* cited by examiner

PLASMA DETEMPLATING AND SILANOL CAPPING OF POROUS DIELECTRIC FILMS

CROSS-REFERENCE TO RELATED APPLICATIONS

This application is a continuation-in-part claiming priority under 35 USC 120 from U.S. patent application Ser. No. 10/404,693 filed Mar. 31, 2003 by Humayun, et al., and titled "METHOD FOR FORMING POROUS FILMS BY POROGEN REMOVAL COMBINED WITH IN SITU SURFACE MODIFICATION." This application is incorporated herein by reference for all purposes. This application is also related to U.S. patent application Ser. No. 10/672,305, filed Sep. 26, 2003; U.S. patent application Ser. No. 10/672,311, filed Sep. 26, 2003; and U.S. patent application Ser. No. 10/807,680, filed Mar. 23, 2004.

FIELD OF THE INVENTION

This invention relates to methods for preparing porous films using porogen technology. More specifically, the methods involve providing a precursor film comprising porogen and a dielectric matrix and removing the porogen and protecting silanol groups within the dielectric matrix using plasma techniques. The resulting material can be used as a low-k dielectric film in integrated circuits.

BACKGROUND OF THE INVENTION

Discovering ways to minimize the resistance-capacitance (RC) delay of metal interconnects is a primary pursuit within the high performance integrated circuit manufacturing industry. The RC delay is the time it takes a signal to propagate through a metal interconnect as a result of the resistance of the metal lines and the capacitance of the surrounding dielectric. Reducing the RC delay increases the speed of the signal propagation, thereby improving the performance of a device. One approach to reducing RC delay is by using lower resistance metals; for example, copper instead of aluminum. Another approach to reducing RC delay is by reducing the capacitance of the surrounding dielectric by using a material with a low dielectric constant, k.

The dielectric constant, k, is an intrinsic property of a material, which determines the electrostatic energy that can be stored within the material. The numerical value k is defined relative to a vacuum, for which k=1, exactly. In IC applications, "low-k" dielectrics are conventionally defined as those materials that have k<~4. This low-k definition comes from the k value of $SiO_2$, the traditional primary IC dielectric material, which has k≈4. Since current technologies involving smaller features sizes are requiring k<4, efforts have been focused on finding materials with lower k than that of $SiO_2$.

One widely used means of obtaining a low-k dielectric material is by incorporating carbon or hydrocarbons into a $SiO_2$ material. Since most hydrocarbons have a lower k than $SiO_2$, the resulting carbon-incorporated material has an overall lower k than pure $SiO_2$—typically between 3.1 and 2.5, depending on the amount of carbon added and the type of organic precursor that is used. However, as IC features continue to decrease to smaller and smaller sizes, there is a drive to find materials with even lower k than can be obtained by using the carbon-incorporated $SiO_2$ alone.

Currently, the only known way to obtain a usable dielectric with k<2.5 is by using techniques to produce pores or voids in a dielectric material with a dielectric constant k≈2.5 to 4. Since the dielectric constant for air is only slightly higher than that of a vacuum, the resulting porous dielectric will have a significantly decreased k. A common technique for fabricating porous dielectric materials involves the formation of a composite film consisting of two components: a porogen (an organic material, typically a polymer) and a silicon-based dielectric. Once the composite film is formed onto the substrate, the organic porogen component is removed, leaving a porous silicon-based dielectric matrix.

There are significant challenges, however, associated with forming a porous dielectric material, particularly in the porogen removal process. A standard technique for porogen removal involves heating the wafer for several hours to thermally degrade and remove the porogen. Another technique involves exposing the wafer to a plasma treatment while heating the wafer. This porogen removal process creates "dangling bonds" (unsaturated SiO- or Si-groups) within the silicon-based dielectric matrix, which when exposed to ambient conditions, will react with moisture to create hydroxyl groups. These hydroxyl groups will in turn adsorb more moisture from the ambient to add water to the silicon-based dielectric matrix. Unfortunately, since water has a dielectric constant of about 80, this significantly increases the overall dielectric constant for the film.

What are needed therefore are improved methods for forming low k dielectric materials for integrated circuits.

SUMMARY OF THE INVENTION

The present invention addresses these needs by providing improved methods of preparing a low-k dielectric material on a substrate. The methods involve providing a precursor layer comprising a hydrocarbon porogen in a dielectric matrix and exposing the precursor layer to a plasma having a silanol capping agent to remove the porogen to create voids within the dielectric matrix and concurrently protect the dielectric matrix with hydrophobic protecting groups. Porogen removal and silanol capping may be performed contemporaneously or sequentially. If performed sequentially, silanol capping is performed without first exposing the dielectric matrix to moisture or ambient conditions.

In one embodiment, the methods include the following sequence of operations: (a) providing a precursor layer on said substrate, said layer comprising an organic porogen in a dielectric matrix; and (b) exposing the precursor layer to a plasma comprising a silanol capping agent provided therein to remove said porogen from the precursor layer to create voids within the dielectric matrix and concurrently protect the dielectric matrix with hydrophobic protecting groups. In another embodiment, the methods include (a) providing a precursor layer on said substrate, said layer comprising an organic porogen in a dielectric matrix; and (b) exposing the precursor layer to a plasma to thereby remove said porogen from the precursor layer to create voids within the dielectric matrix; and (c) after removing said organic porogen, exposing the dielectric matrix to a silanol capping agent, without first exposing the dielectric matrix to moisture or ambient conditions. In some embodiments, after (a), the precursor layer is exposed to ultraviolet radiation to remove at least a portion of the porogen before (b).

The precursor layer is formed by chemical vapor deposition, plasma-enhanced chemical vapor deposition, a print on process, dip casting, a spin on process, a spray on process or supercritical dielectric infusion in polymer matrix. In some embodiments, the porogen in the precursor layer is a hydrophobic phase of a block copolymer. In preferred embodiments, the dielectric matrix comprises silicon and oxygen, more preferably silicon, oxygen, carbon, and hydrogen. In specific embodiments, the dielectric matrix is derived from at least one of TEOS and MTEOS.

Any suitable capping agent can be used. In some embodiments, the silanol capping agent comprises one or more of a silane amine, a disilazane, a chlorosilane, an aldehyde, an alkylsiloxane and an alkyl alkoxysilane. In preferred embodiments, the silanol capping agent comprises one or more of hexamethyldisilazane (HMDS), dimethyldimethoxysilane (DMDMOS), trimethylchlorosilane, and an acetaldehyde.

To remove the porogen, the plasma comprises either a reducing gas, such as at least one of hydrogen, ammonia, carbon monoxide and methane, or an oxidizing gas, such as at least one of carbon dioxide, nitrous oxide and oxygen. The plasma may also include nitrogen or unreactive gases such as at least one of nitrogen, argon or helium on their own or as carrier gases. In one approach, the substrate and precursor layer remain under vacuum during the porogen removal and silanol capping operations, and at all times in between. This may be accomplished by performing the removal and capping operations at different stations in a multistation tool.

The precursor films may be either exposed directly to the plasma such as by using a planar or barrel type reactor or the films may be exposed to downstream plasma to prevent direct ion bombardment of the film. The plasma may be generated by a high or low frequency source or may be generated by a combination of high and low frequency source(s).

In embodiments wherein the porogen removal and silanol capping occur concurrently, the silanol capping agent may be introduced to the plasma using a carrier gas. In other embodiments, no carrier gas is used. The plasma source power, substrate temperature, dosage of silanol capping agent, chamber pressure and exposure times will vary depending upon plasma reactor set up and plasma composition. Typical plasma source powers range between about 100 and about 2000 Watts. Typical substrate temperatures during plasma exposure ranges between about 100 and about 400 degrees Celsius. In one embodiment, the flow rate of silanol capping agent provided in the plasma range between about 0.2 and about 20 ml/minute and preferred chamber pressures range between about 1 and about 10 Torr. Typical plasma exposure time ranges between about 5 seconds and 20 minutes.

In embodiments wherein the porogen removal and silanol capping occur sequentially, the dielectric matrix can be exposed to the silanol capping agent by way of one of a vapor phase, liquid phase, supercritical phase or plasma phase. In preferred embodiments, the silanol capping agent is provided in a second plasma. If provided in a second plasma, the silanol capping agent may be provided with or without a carrier gas. The carrier gas may comprise a reducing gas such as those produced by adding at least one of hydrogen, ammonia, carbon monoxide and methane. Alternatively, the carrier gas may comprise an oxidizing gas such as at least one of carbon dioxide, nitrous oxide and oxygen. Additionally, at least one of nitrogen, argon or helium may also be used as the carrier gas. The second plasma source power, substrate temperature, dosage of silanol capping agent, chamber pressure and exposure times will vary depending upon plasma reactor set up and plasma composition.

These and other features and advantages of the invention will be described in detail below with reference to the associated drawings.

BRIEF DESCRIPTION OF THE DRAWINGS

The following detailed description can be more fully understood when considered in conjunction with the drawings in which.

DETAILED DESCRIPTION OF THE PREFERRED EMBODIMENTS

Introduction

In the following description, numerous specific details are set forth in order to provide a thorough understanding of the present invention, which pertains to porogen removal and "silanol capping" treatment during formation of a porous dielectric material. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

For many embodiments of the invention, the substrate is a semiconductor wafer. A semiconductor wafer as discussed in this document is a semiconductor substrate at any of the various states of manufacture/fabrication in the production of integrated circuits. The terms "wafer," "substrate," "semiconductor wafer," and "wafer substrate" are used interchangeably herein. It is noted, that the invention is not limited to semiconductor wafers. For example, these methods may be used for treating mesoporous molecular sieves.

The present invention involves forming a low k dielectric material by way of a "precursor layer" that contains both a porogen and a dielectric matrix formed in regions around the porogen. During methods of this invention, the porogen is removed from the precursor layer to create a low-k dielectric layer. Within the precursor layer, the porogen resides in locations that will subsequently become void locations in the final dielectric layer. Hence, the porogen and dielectric matrix typically exist as separate phases within the precursor layer. To some degree, the porogen defines the porosity, void volume, tortuosity and other parameters characterizing the pore morphology in the final low-k dielectric material. In some cases, the pore morphology is set before the porogen is removed. In other cases, it is set during the porogen removal process. Further, the dielectric matrix may assume its final composition and structure either before or during the porogen removal process. A precursor layer may be formed by any one of many different techniques including spin-coating processes, supercritical infusion into a polymer matrix, print-on, dip coating, and chemical vapor deposition—particularly plasma enhanced chemical vapor deposition (PECVD).

Generally, a porogen is any removable material that defines void regions in a dielectric matrix. In the case of an ordered porous or mesoporous dielectric matrix, the porogen is frequently referred to as a "template." In many cases, the porogen comprises an organic material. Its properties depend upon the means by which it is removed from the precursor layer. Porogens are commonly removed from the precursor layer by decomposition, volatilization, and/or solvation. Thus, some porogens are highly volatile at elevated temperatures. Others are soluble in particular solvents. Still others are readily decomposed by heat, plasma, radiation, e-beam, microwave etc.

In one important dielectric formation process, the porogen is a block copolymer having chemically distinct components that segregate into separate phases. For example, block copolymers may be structured such that long range ordered hydrophilic and hydrophobic phases are formed within the film by amphiphilic self-assembly. One example of such a polymer is a block copolymer of PEO polyethylene oxide and PPO polypropylene oxide. If such block copolymers are used, a hydrophilic catalyst and dielectric precursor (e.g., TEOS) preferentially segregate into the hydrophilic regions (i.e., the PEO regions) where the dielectric precursor reacts to form dielectric. After removal of the porogen, an ordered porous dielectric matrix is left. The ordered structure of the porous film is dictated by the relative amounts of PEO and PPO.

Techniques for forming ordered mesoporous layers will be described further. Note that the invention is not limited to mesoporous layers of this type. For example, the present invention can be employed with non-ordered porous precursor layers, having pores of various sizes. Note that according to the International Union of Pure and Applied Chemistry (IUPAC), mesoporous materials are defined as those with pore diameters between 2 nm and 50 nm. The present invention, however, is not limited to this strict definition of mesoporous material in that porous materials having pores of any size may be formed. As such, the term "mesoporous" as used herein will refer broadly to porous materials having any pore size. In a number of embodiments, typical mesoporous materials will have pore diameters ranging between about 0.5 nm and about 50 nm.

Further, the invention is not limited to silicon dioxide dielectric materials. It can be used to produce a wide variety of silicate materials to carbon-containing dielectrics, for example. The invention can also be used to produce porous metal containing materials such as metal oxides.

Mesoporous Precursor Layers

In one example, the process chemistry for creating a mesoporous precursor layer employs four reagents to form a mesoporous precursor layer. These are (a) a template-forming precursor (e.g., a surfactant type block copolymer), (b) a silica-forming precursor such as TEOS (tetraethyl orthosilicate), (c) a solvent such as water and/or ethanol, and (d) a catalyst such as an acid to help drive the reaction. Many common spin-coat techniques involve mixing all the reactant components together and spin-coating the mixture onto the substrate in one process step. Solution spreading, drying, block copolymer segregation, and silica formation take place all at once. Other methods, such as those described in previously referenced U.S. patent application Ser. No. 10/295,965, involve a two-step process in which the template-forming precursor, solvent and catalyst are mixed and applied by spin-coat or print-on methods to form the template in a first process step, then the silica-forming precursor is introduced to the formed template in a second process step. In one embodiment, the silica-forming precursor is introduced in the form of a supercritical fluid (e.g. TEOS dissolved in $CO_2$) so that it can readily infuse into the hydrophilic void regions of the formed template.

Many variations on the basic process are possible. Some of these will now be described briefly. In one example, a field generator is employed during the deposition process to apply an electric field to align electrostatic domains and/or ordered structures (e.g., micelles) within the precursor layer. In one embodiment, the template-forming precursor liquid contains a polymer (e.g. PEO-PPO-PEO block copolymer) or mixture of polymers dissolved in a solvent that evaporates to form the desired mesoscale structure. In another embodiment, a template-forming precursor liquid forms a block copolymer from resins that undergo polymerization with micelles that coalesce to yield a mesoscale structure. The micelles can be produced from a long-chain surfactant. The template-forming precursor liquid reacts and/or dries to provide a mesostructured matrix. The wafer is heated to selectively evaporate solvent from the template-forming precursor liquid, leaving a mesostructured template on the substrate.

After the template is formed, a silica-forming precursor liquid may be introduced to form a mesoporous silica compound. Alternatively, this precursor material may be introduced earlier, together with all other components of the precursor layer. Examples of suitable silica-forming compounds include TEOS, tetramethoxysilane (TMOS), an organic alkoxysilane such as methyl triethoxysilane (MTEOS), methyltrimethoxysilane (MTMOS), dimethyldimethoxysilane (DMDMOS), dimethyldiethoxysilane (DMDEOS), a bridged siloxane such as bis-triethoxysilylethane (BTEOSE) or bis-triethoxysilylmethane (BTEOSM), a cyclic siloxane such as tetramethylcyclotetrasiloxane (TMCTS), octamethylcyclotetrasiloxane (OMCTS) and mixtures of these precursors. These compounds are dissolved in a solvent to form the silica-forming precursor liquid. In one example, TEOS is dissolved to a 2% by weight concentration in a supercritical carbon dioxide solvent. Alternatively, where mesoporous metal oxides are desired, a metal-organic compound may be used where the metal-organic compound is compatible with the deposition chemistry. For example, metal alkoxides may be used with or without sol-gel forming acid catalysts. Compatible liquid solvents such as alkanes, cycloalkanes, and carboxylic acids may also be used to adjust the viscosity and/or vapor pressure of the silica-forming precursor liquid.

The resulting film will be an ordered mesoporous precursor layer suitable for applying methods of the present invention.

In another approach, a non-ordered porous precursor film is formed from a porogen that does not necessarily form an ordered arrangement of the type produced by amphiphilic self-assembly with block copolymers. In one example the precursor film is formed by co-deposition of porogen and dielectric material as by a PECVD process. Frequently, in such processes, the porogen is a hydrocarbon. The porogen may either be a separate molecule delivered simultaneously with the structure-forming precursor, or it may be covalently bonded to the precursor molecule. The structure-forming precursor and the porogen are delivered to the PECVD chamber and deposited on the wafer.

In a second step the porogen is removed to generate a porous film. The porogen removal step may be performed in situ in the same chamber or in a separate module or station. The porogen may be removed by a variety of methods including thermal degradation, exposure to UV radiation, exposure to e-beam or microwave energy. If thermal degradation is employed as the porogen removal step, the temperature of the wafer during the deposition process should be low enough to prevent the vaporization of the porogen, typically <250 C, and often as low as room temperature. Then, in the second step, the film is heated, typically to about 400 C, and the porogen either decomposes or vaporizes and is removed from the film, leaving behind voids. It is also possible to use higher wafer temperatures during the deposition process and then use UV radiation, e-beam or microwave methods to remove porogen. Methods of the present invention may be applied to either an as deposited film with the porogen still intact or after it has been partially or completely removed by any of various methods such as those listed above (i.e., thermal degradation, UV radiation, e-beam or microwave exposure).

Note that this invention can be employed to form porous versions of many different materials, not just silicon oxides and silicates. Examples include metal oxides (e.g., oxides of Zr, Ti, Al and V), mixed metal oxides (e.g., superconducting perovskites such as the Y—Ba—Cu—O material), metals (e.g., Cu, Pt, Pd, and Ti), mixed metals, elemental semiconductors (e.g., Si, Ge, and C), compound semiconductors (e.g., III-V semiconductors such as GaAs and InP, II-VI semiconductors such as CdS, and IV-VI semiconductors such as PbS). Appropriate precursors will be apparent to those of skill in the art. As an example, many metal alkoxides are suitable metal oxide precursors.

Methods of the invention involve removing porogen material from a precursor layer using a plasma. When the porogen is removed, the dielectric regions of the precursor layer remain intact on the substrate leaving a dielectric matrix, sometimes referred to as a "dielectric backbone." These terms will be used interchangeably herein. Methods also involve "capping" hydrophilic regions in the dielectric matrix using a "silanol capping" agent. Details for implementing two preferred embodiments will now be described.

Embodiment 1

Plasma Porogen Removal and In Situ Silanol Capping

Figure 1A:
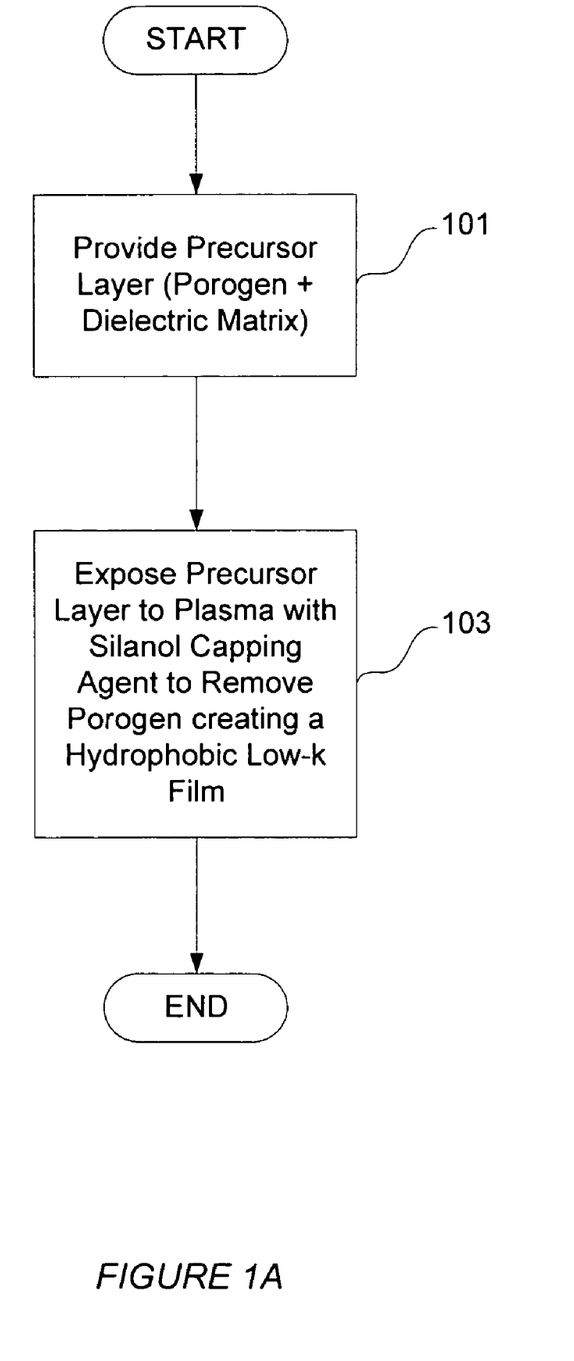
FIGS. 1A and 1B are flowcharts summarizing the stages of two preferred embodiments of the invention.

FIG. 1A is a flowchart summarizing aspects of a first embodiment of the invention. First, as indicated at block 101, a substrate with a deposited precursor layer is provided. As described previously, the precursor layer may be an ordered or mesoporous precursor layer or it may be a non-ordered precursor layer. In preferred embodiments, the precursor layer is an ordered mesoporous layer comprising template porogen and a silicon-containing dielectric phase which will become the dielectric matrix once the porogen is removed. In cases wherein a mesoporous precursor layer is used, this process is called "detemplating."

Next, one of various suitable plasma techniques is used to 1) remove at least a portion of the porogen material from the precursor layer and to 2) protect or "cap" hydrophilic portions of the dielectric matrix using a "silanol capping" agent. See 103. For removing porogen, any suitable plasma method that can cause the breakdown of the organic components of the porogen material may be used. The plasma power source can be either high frequency, low frequency or a combination of the two. In general, a high frequency power component accelerates the dissociation of chemical species in the plasma while a low frequency power component emphasizes the bombardment effect to the substrate. In one example, the high frequency plasma source has a frequency of 13.5 MHz while the low frequency source is 400 kHz. Note that other porogen removal methods, such as thermal degradation, UV exposure, microwave exposure, electron beam exposure, supercritical processes, volatilization and solvent extraction, have been described in U.S. patent application Ser. No. 10/404,693, which is incorporated in its entirety herein. One advantage of using plasma exposure techniques is that they can be conducted at relatively low temperatures and/or for relatively short times compared to, for example, thermal degradation techniques.

It has been found that a reducing plasma, usually comprising hydrogen and nitrogen, is effective for removing porogen without damaging the dielectric backbone. However, use of nitrogen can result in incorporation of nitrogen into the dielectric layer, which can cause later process integration issues. For example, if a photoresist is deposited thereon, the nitrogen may react with the photoresist to produce problematic "mushroom" structures. Oxidizing plasmas, however, have been found to attack and cause damage to the dielectric backbone. To address this problem, experiments with oxidizing plasma using less aggressive conditions (e.g., using milder oxidants such as $CO_2$) have been preformed and have been shown to create less damage to the dielectric backbone. Results from some of these experiments are described later.

In this first embodiment, porogen removal and silanol capping occur simultaneously using a single plasma. That is, the plasma comprises agents for removing porogen as well as silanol capping agents. In general, a silanol capping process helps to stabilize the porous dielectric matrix. The silanol capping agent can replace or protect the polar, hydrophilic hydroxyl (—OH) groups within the dielectric matrix with non-polar groups (e.g., alkyl groups), thereby rendering the film hydrophobic and allowing it to maintain a low overall dielectric constant, even when exposed to ambient moisture. Technically, silanol cappng in this context involves removing an acidic proton to form SiO— then protecting it as a silyl ether. Silanol capping may also involve tying up "dangling bonds," reactive unpaired valence electrons. As used herein, the term "silanol capping" and variations thereof refer broadly to any processes that involve replacing or protecting hydroxyl groups, dangling bonds, and other reactive or hydrophilic groups with hydrophobic groups.

Many silanol capping agents are suitable for this invention. Examples include, but are not limited to, disilazanes such as hexamethyldisilazane (HMDS), chlorosilanes such as trimethylchlorosilane, aldehydes such as acetaldehyde, alkylsiloxanes such as dimethyldimethoxysilane (DMDMOS), and cyclic siloxanes such as TMCTS or OMCTS. If HMDS is used, for example, the SiO— groups will be protected with $Si(CH_3)_3$ groups forming $SiOSi(CH_3)_3$ moieties within the film.

In preferred embodiments, the silanol capping agent is introduced into a plasma that already has porogen removal agents. Note that the silanol capping agent may also act as a porogen removal agent itself. For example, HMDS may be injected into a $H_2/N_2$ containing plasma. The HMDS may be injected with or without a carrier gas. If a carrier gas is used, it is preferably an inert gas such as argon or helium. Other gases including nitrogen or hydrogen or gas mixtures may also be used. The $H_2/N_2$ and HMDS plasma contacts a heated wafer to remove porogen and form methylated surface groups. The relative amounts of $H_2/N_2$ can vary. In one example, the plasma contained approximately 90% nitrogen and 10% hydrogen. Preferred wafer substrate temperatures range between about 100 and 450 degrees Celsius, more preferably between about 200 and 400 degrees Celsius. Plasma exposure times can vary broadly depending upon plasma composition and other process parameters, but usually range between about 1 and 30 minutes. In one example, a $H_2N_2$ and HMDS plasma exposure of the dielectric matrix for a period of between about 1 and 2 minutes was found to be effective. The optimum conditions for the plasma exposure including gas flow rates and the plasma source power depend on the configuration of the plasma reactor. Plasma power ranges will depend significantly on the configuration and type of apparatus used and on the number of stations in the apparatus. In a specific example, a six showerhead Concept 2 SEQUEL™ tool from Novellus systems is used. Using the SEQUEL™ tool, preferred plasma source powers (for both high frequency and/or low frequency sources) range between about 100 and 2000 Watts distributed over six showerheads, more preferably between about 150 and 500 Watts. Power ranges for either low or high frequency sources can vary depending upon a number of factors including tool configuration, number and size of wafers exposed and type of plasma(s) used (e.g., direct or downstream plasma). Preferred pressures range between about 1 and 20 Torr, more preferably between about 2 and 5 Torr. The dosage of silanol capping agent will also vary broadly and depend upon a number of process parameters. In one example, HMDS was injected into the plasma at about 0.6 ml/min.

The porogen decomposition components and other byproducts may be removed by volatilization (e.g., heating the wafer substrate and pumping away the residuals). Any suitable plasma reactor may be used. An example of a suitable apparatus is described later.

After the porogen is removed and the dielectric matrix is sufficiently treated, the process flow of FIG. 1A is complete.

Embodiment 2

Plasma Porogen Removal Followed by Silanol Capping

Figure 1B:
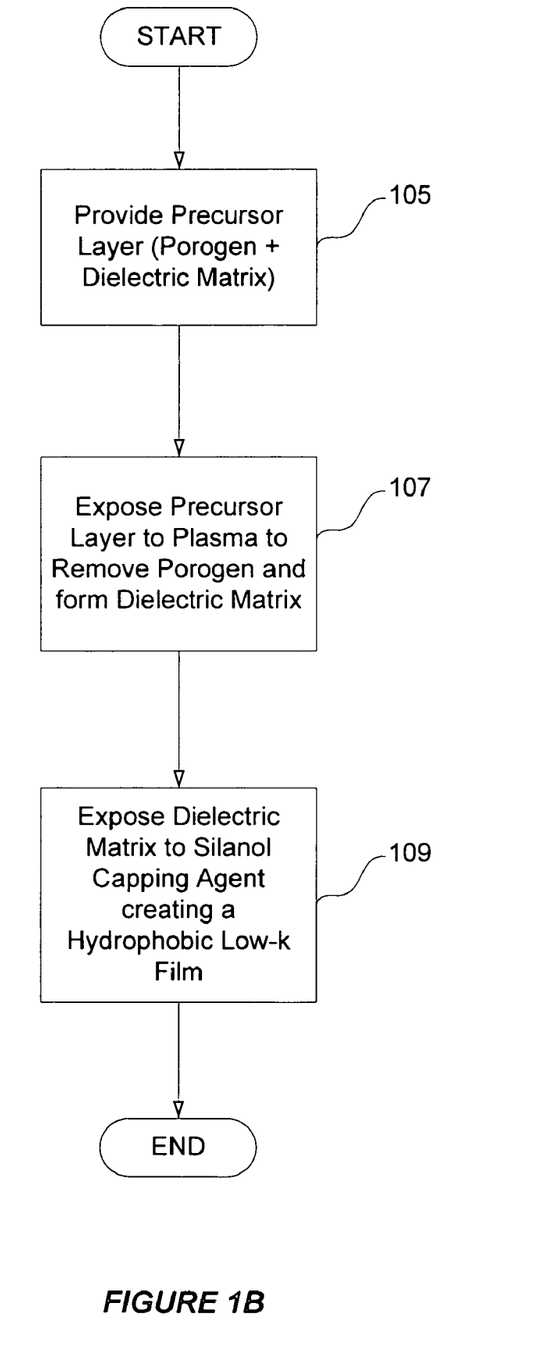

FIG. 1B is a flowchart summarizing aspects of a second embodiment of the invention. First, as indicated by block 105, a substrate with a deposited precursor layer is provided as described in the previous embodiment. Next, as indicated in block 107, the porogen is removed from the precursor layer using a plasma process. As in the previous embodiment, the plasma may be a reducing plasma or an oxidizing plasma. Plasma conditions and compositions are similar to those of the previous embodiment but without the silanol capping agent. As in the previous embodiment, the porogen decomposition components and other byproducts may be removed by volatilization (e.g., heating the wafer substrate and pumping away the residuals).

After porogen removal, the resulting dielectric matrix is exposed to a silanol capping agent, as indicated by process block 109. Note that this silanol capping process is preferably done without exposing the dielectric matrix formed at block 107 to ambient. This is to prevent ambient moisture from adsorbing onto the dielectric matrix, which will cause the overall k of the dielectric matrix to increase dramatically, as described previously. Again, the dielectric constant of water is about 80. Therefore, preferable methods include those in which the porogen removal and silanol capping processes are done in the same chamber or in which the vacuum is not broken between the two processes such as in a cluster type of apparatus. An example suitable apparatus is described later.

As in the previous embodiment, any suitable silanol capping agent can be used, including HMDS, chlorosilanes such as trimethylchlorosilane, aldehydes such as acetaldehyde, and alkylsiloxanes such as DMDMOS. Any suitable method for exposing the dielectric matrix to the silanol capping agent can be used. For example, the silanol capping agent may be introduced in vapor phase from a bubbler, or through a liquid delivery system. Alternatively, a supercritical solution process may be used. In preferred embodiments, the silanol capping agent is introduced to the dielectric matrix in a plasma. The plasma is preferably either a reducing plasma (e.g., $H_2/N_2$) or a mild oxidizing plasma (e.g., $CO_2$) such as described in the previous embodiment. As in the previous embodiment, the silanol capping agent may be introduced to the plasma with or without a carrier gas. The flow rate of the silanol capping agent can depend upon a number of factors including the apparatus configuration and desired partial pressure to be achieved. In one example using the Novellus Concept 2 SEQUEL™ system, preferred flow rates of silanol capping agent ranged between about 0.2 and 2 ml/min. Preferred exposure times of the dielectric matrix to the plasma containing the silanol capping agent range between about 5 seconds and 20 minutes. Preferred plasma source powers range between about 150 and 500 Watts and preferred substrate temperatures range between about 100 and 400 degrees Celsius. Preferred chamber pressures range between about 2 and about 5 Torr.

After the dielectric matrix is sufficiently treated and the silanol capping processes is complete, the process flow of FIG. 1B is complete.

a. Apparatus

As mentioned previously, this invention is not limited to any particular plasma apparatus. Generally, the apparatus will include one or more chambers (sometimes referred to as process vessels) that house one or more wafers during porogen removal and silanol capping. A single chamber may be employed for both operations or separate chambers may be used. The one or more chambers maintain the wafer in a defined position or positions (with or without motion within that position, e.g. rotation, vibration, or other agitation) during porogen removal and silanol capping. The wafer may also be placed on a heating platen.

Importantly, the apparatus will protect wafers from exposure to ambient from the time when porogen removal begins until silanol capping is complete. This may be accomplished by a vacuum integration tool—such as a cluster tool—that provides multiple chambers all enclosed within or linked together via loadlocks to a larger vacuum chamber. Examples of such apparatus include the Concept 2 SEQUEL™, SPEED, SPEED-SEQUEL™, Concept 3 SEQUEL™ and VECTOR™ platforms from Novellus Systems, Inc. of San Jose, Calif.

In a process environment, it may be beneficial to perform the porogen removal and silanol capping operations in the same apparatus as where the precursor layer is formed. As such, a multi-station tool for the various operations may be used. In some situations, the tool may include up to five chambers. For example, a first chamber may be reserved for template formation using a block copolymer. Second and third chambers are used to infuse dielectric precursors into a mesoporous template formed in the first chamber. The precursors react to form a dielectric matrix in one phase of the template. Then, in a fourth chamber, the template-dielectric layer is detemplated. Finally, in a fifth chamber, the resulting dielectric matrix is silanol capped. In embodiments where the porogen removal and silanol capping occur simultaneously, the fourth chamber is used for porogen removal and silanol capping processes. If separate chambers are employed for porogen removal and silanol capping, the apparatus should be used in a manner that protects the dielectric matrix from exposure to moisture between the operations. In one embodiment, the entire apparatus is enclosed in a vacuum compartment. In another embodiment, the wafer path between the porogen removal and silanol capping chambers is maintained under vacuum.

Figure 2:
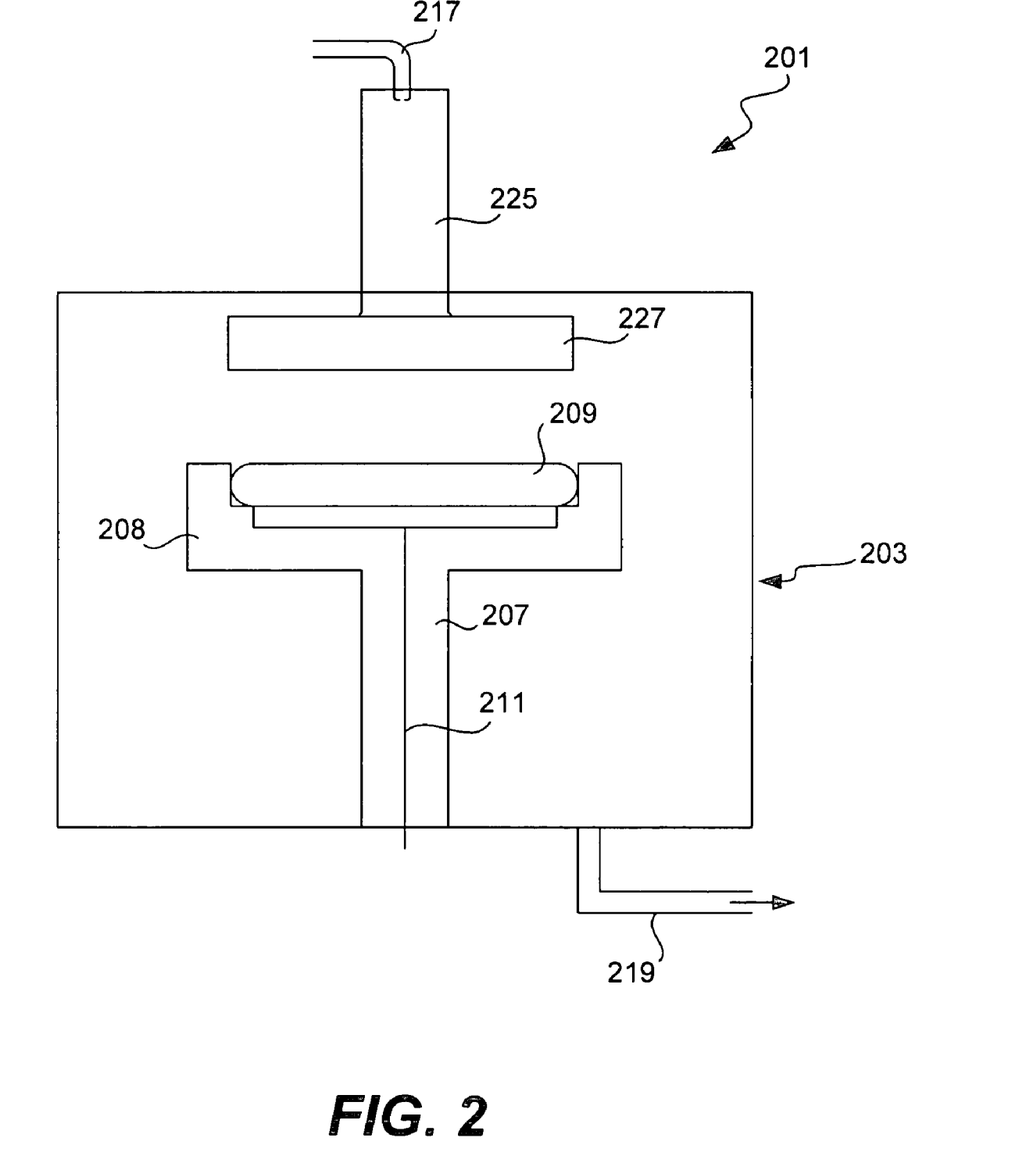
FIG. 2 shows a plasma system that may be used to perform operations in accordance with some embodiments of this invention.

FIG. 2 is a block diagram depicting some components of a suitable plasma reactor for performing the invention. Note that this diagram depicts only a single plasma reactor chamber, which may be a part of a stand-alone single chambered apparatus or as one chamber of a multi-chambered apparatus as described above. Although various details of the apparatus have been omitted for clarity's sake, various design alternatives may be implemented. Therefore, the present examples are to be considered as illustrative and not restrictive, and the invention is not to be limited to the details given herein, but may be modified within the scope of the appended claims.

As shown, a reactor 201 includes a process chamber 203, which encloses components of the reactor and serves to contain the reactant gases and provide an area to introduce the reactant gases to substrate 209. In one example, the process chamber walls are made from aluminum. Within the process chamber, a wafer pedestal 207 supports a substrate 209. The pedestal 207 typically includes a chuck 208 to hold the substrate in place during the deposition reaction. The chuck 208 may be an electrostatic chuck, a mechanical chuck or various other types of chucks as are available for use in the industry and/or research.

A heat transfer subsystem including lines 211 for supplying a heat transfer fluid to the pedestal 207 controls the temperature of pedestal 207. In some embodiments, the heat transfer fluid comprises water or another liquid. In other embodiments, the pedestal 207 is heated electrically. The reactant gases (i.e., the porogen removal gases and silanol capping agent), as well as inert gases (if used), are introduced individually into the reactor at tube 225 via inlet 217. A showerhead 227 may be used to distribute the gas flow uniformly in the process reactor. Note that the shape of showerhead 227 may vary with different apparatus configurations. In one embodiment, showerhead 227 is plate-shaped and situated above and parallel to substrate 209. Showerhead 227 is preferably RF biased while tube 225, via inlet 217 and process chamber 203 are at ground potential. These conditions can be achieved, for example, by electronically isolating showerhead 227 using a ceramic casing (not shown) from other components of the apparatus. A vacuum pump (e.g., a turbomolecular pump or a mechanical pump) connected to outlet 219 can draw out gases between processes. Note that FIG. 2 illustrates an apparatus where the substrate is directly exposed to plasma. In some embodiments, the plasma source is remote or downstream from the substrate. This downstream plasma source configuration is not shown.

As mentioned previously, embodiments of the invention may involve a supercritical process for introducing the silanol capping agent. An example of an appropriate supercritical apparatus is described, for example, in U.S. patent application Ser. No. 10/404,693, which is incorporated in its entirety herein.

FTIR Experiments

Figure 3:
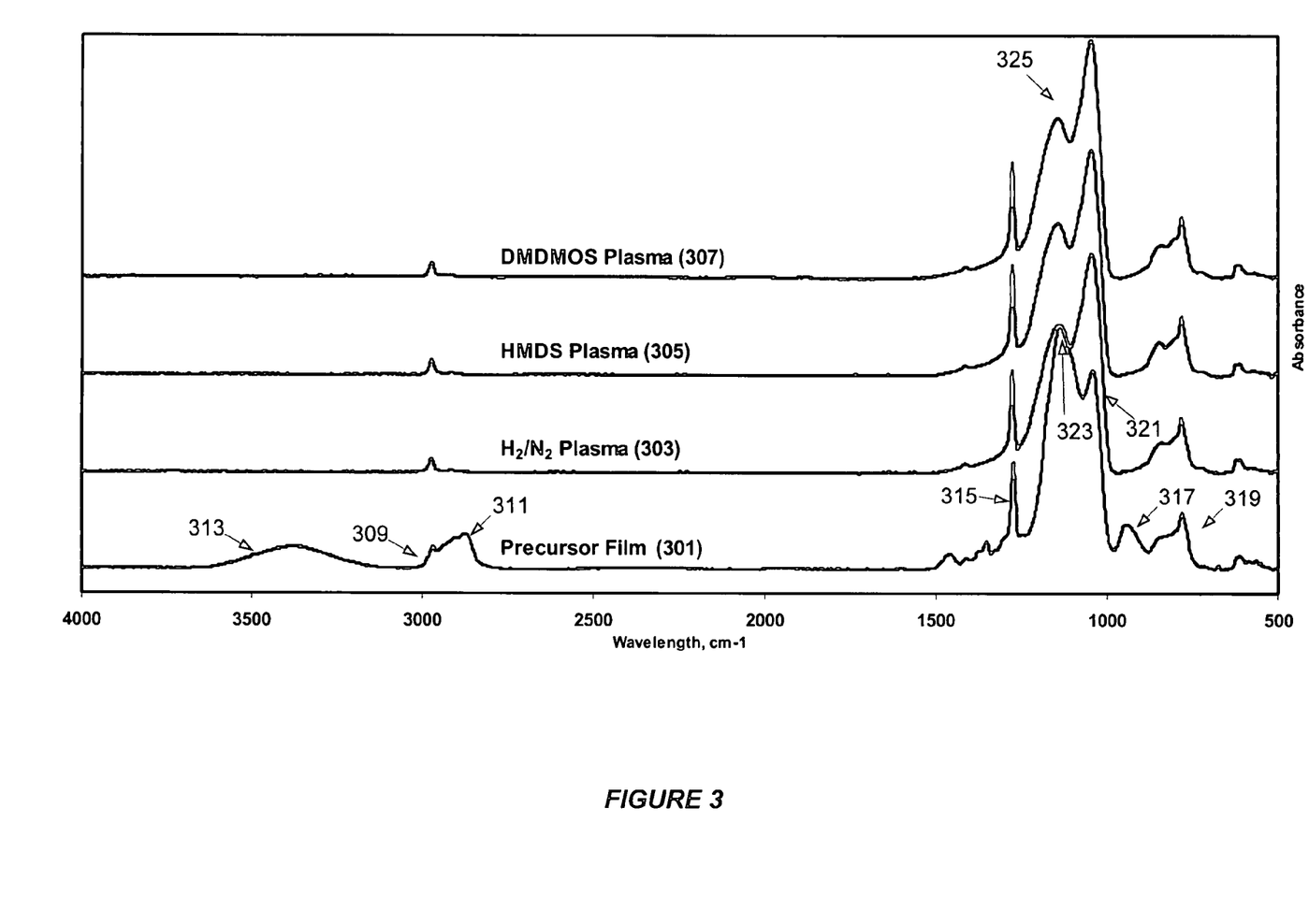
FIG. 3 is a composite figure of FTIR spectra of mesoporous silica films before and after various treatment methods in accordance with the invention.

FIG. 3 is a composite graph of four Fourier transform infrared (FTIR) spectra of a mesoporous silica films. All samples are composite films made from tetraethyl orthosilicate (TEOS) and methyl triethoxysilane (MTEOS) precursors using at least one of the porous film formation methods described in U.S. patent application Ser. No. 10/404,693.

The curve 301 represents the FTIR spectrum of a TEOS/MTEOS porogen-containing precursor film without treatment. Curves 303, 305 and 307 are spectra of TEOS/MTEOS precursor films taken shortly after treatment with plasma comprising $H_2/N_2$ only (no silanol capping agent), HMDS and DMDMOS, respectively. Process parameters for the treated films included plasma power of about 160 Watts distributed over six showerheads in a SEQUEL™ tool from Novellus, substrate temperature of about 400 degrees Celsius, pressure of about 2.5 Torr and with plasma exposure times of about 1 to 2 minutes. For the samples with silanol capping agents (see spectra 305 and 307), the dosage of silanol capping agent was about 0.6 mL/min.

As shown by comparing the pretreated film (curve 301) to the three treated films (curves 303, 305 and 307), all three types of plasma processes effectively remove porogen material. Specifically, curve 301 (untreated film) has peak 311, indicating the presence of $CH_x$ groups from the hydrocarbon template, and a large peak 323, attributed to the CO ether linkages in the template along with some contribution from the SiO cage structures in the backbone. Peak 311 does not appear in the treated film spectra 303, 305 and 309. In addition, peak 323 is largely reduced in the treated film spectra 303, 305 and 309 as the template is removed but the SiO remains. Note that the peaks that still exist at around 1100 $cm^{-1}$ in the spectra of the treated films 303, 305 and 309, such as peak 325, are attributed to the presence of SiO groups from the backbone.

Note that in spectrum 301 of the untreated film a broad peak 313 and peak 317 are present and they do not appear in the treated films' spectra 303, 305 and 307. These peaks (313 and 317) are attributed to $H_2O$ that the porogen removal process also removes. Note that since the spectra of these treated films were taken very shortly after the plasma porogen removal process, there is no noticeable presence of $H_2O$ in the $H_2/N_2$ only (no silanol capping agent) spectrum 303. However, if an FTIR were taken of this sample (303) after the sample is exposed to ambient for some time, the spectrum would show a significant presence of $H_2O$ and the dielectric constant, k, of the film would be significantly increased. This would not be the case for the samples of spectra 305 and 307, which were treated with plasma containing silanol capping agents and would therefore be resistant to $H_2O$ adsorption and the drift in k would be much less.

Other identifiable peaks in the spectra of FIG. 3 include peaks 309, 315 and 319 attributed to $SiCH_3$ groups and peak 321 attributed to the linear chain $SiO_2$ groups of the dielectric backbone, which are present in the untreated and treated films.

Figure 4:
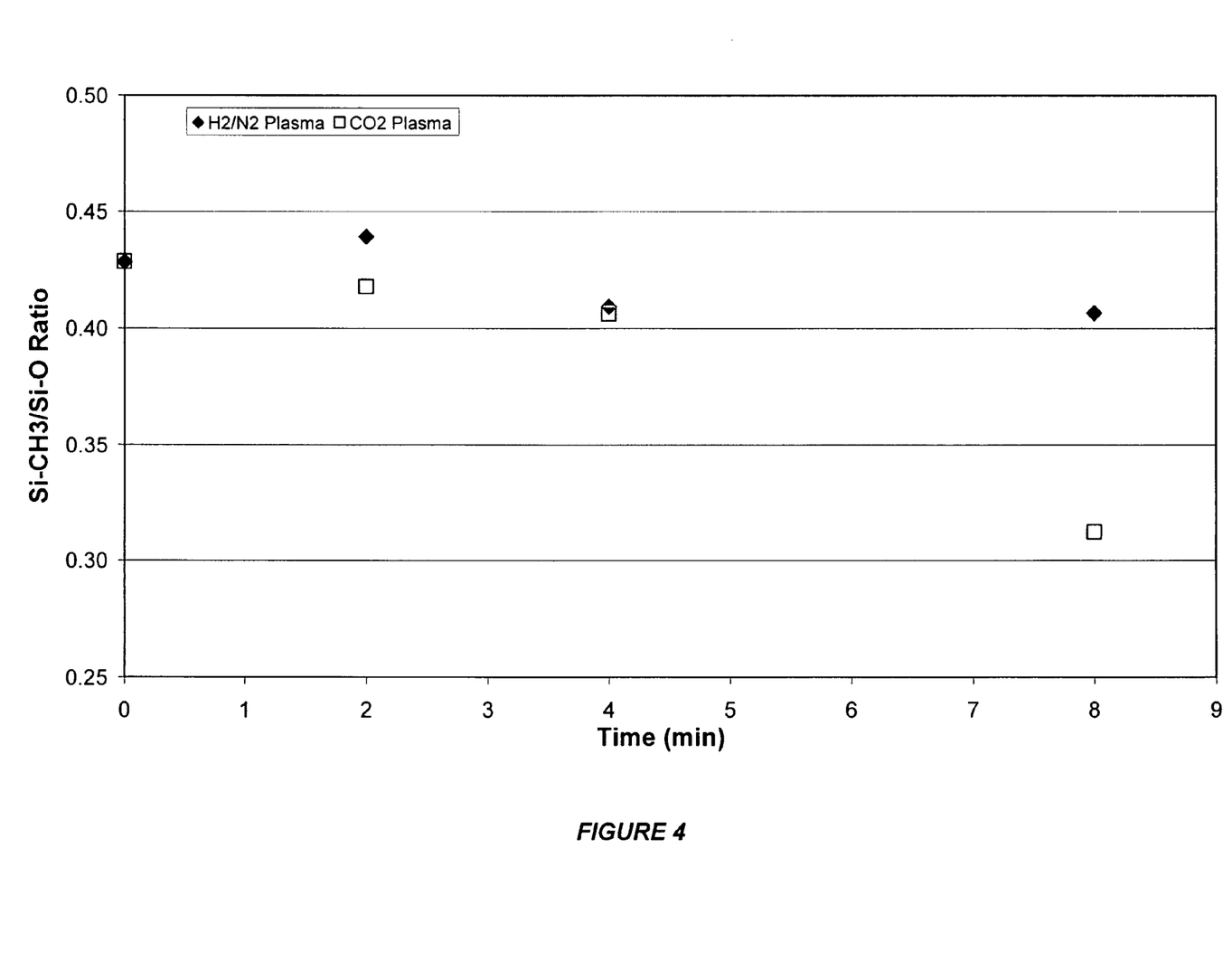
FIG. 4 is a graph showing the amount of damage to the dielectric backbone of a porous film as a result of using a $H_2/N_2$ plasma compared to using $CO_2$ plasma.

FIG. 4 is a graph showing data generated from FTIR spectra of two TEOS/MTEOS precursor samples, one treated with a $H_2/N_2$ plasma and the other treated with a $CO_2$ plasma. Neither sample was treated with a silanol capping agent. The graph of FIG. 4 shows the effect on films in using a reducing plasma (i.e., $H_2/N_2$) versus an oxidizing plasma (i.e., $CO_2$).

As mentioned previously, ordinarily using an oxidizing plasma is not considered an ideal method of removing porogen since an oxidizer can not only remove template material but also attack and remove silcon-bonded organic groups, such as Si—$CH_3$ groups in TEOS/MTEOS precursor films, that are part of the dielectric matrix backbone. Removing these silcon-bonded organic groups, as discussed previously, would result in dangling unsaturated Si-groups, which form hydroxyl groups and, which in turn make the dielectric matrix more susceptible to water adsorption. It was found, however, that weak oxidizing plasmas, such as a $CO_2$ plasma, can be used under low plasma power conditions without too much degradation of organic groups in the dielectric matrix backbone.

To illustrate this, FIG. 4 is a graph showing the ratio of the FTIR peak intensity of Si—$CH_3$ to Si—O present in two TEOS/MTEOS precursor films treated with $H_2/N_2$ plasma and $CO_2$ plasma as a function of treatment time. Each TEOS/MTEOS precursor film was formed using similar process techniques and parameters as used to create films of FIG. 3. Conditions for the film treated with $H_2/N_2$ plasma were plasma power of about 160 Watts over six showerheads, $H_2$ partial pressure of about 2 Torr, $N_2$ partial pressure of about 0.5 Torr and substrate temperature of about 400 degrees Celsius. Conditions for the film treated with $CO_2$ plasma were plasma power of about 160 Watts, $CO_2$ pressure of about 2.5 Torr and substrate temperature of about 400 degrees Celsius. Other process parameters were the same as in the experiment described for FIG. 3. FTIR analyses were performed on each film after 0, 2, 4 and 8 minutes of plasma exposure times. The intensities of the Si—$CH_3$ peaks as measured by FTIR spectra are direct indications as to the amount of silicon-bonded methyl groups in the dielectric matrix of the films. Each film is compared by using the ratio of the FTIR peak intensities of Si—$CH_3$ to Si—O for each film. As shown by FIG. 3, the Si—$CH_3$ to Si—O FTIR peak intensity ratio for the plasma untreated films (at time=0) was about 0.43. After about 4 minutes of plasma treatment, the Si—$CH_3$ to Si—O peak ratio of both films remained above 0.40. However, after about 8 minutes of plasma treatment, the Si—$CH_3$ to Si—O peak ratio of the film treated with $H_2/N_2$ plasma remained above 0.40 but that of the film treated with $CO_2$ plasma was reduced to about 0.32.

Thus, while the $H_2/N_2$ plasma was better at not damaging the Si—$CH_3$ bonds within the dielectric backbone, the $CO_2$ plasma was also shown to not substantially damage the Si—$CH_3$ bonds up to at least 4 minutes. These oxidizing conditions, therefore, may be used, for example, in instances where it is preferable to avoid incorporation of any nitrogen into the film. In addition, a mixture of $H_2$ and $CO_2$ can be used wherein film properties such as the dielectric constant and film hardness can be modulated by adjusting the relative amounts of $H_2$ and $CO_2$.

OTHER EMBODIMENTS

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of preparing a low-k dielectric material on a substrate, the method comprising:
   providing a precursor layer on said substrate, said layer comprising an organic porogen in a dielectric matrix; and
   exposing the precursor layer to a plasma comprising a reducing or oxidizing agent and a silanol capping agent to concurrently remove said porogen from the precursor layer and protect the dielectric matrix with hydrophobic groups.

2. The method of claim 1, after providing the precursor layer on the substrate, further exposing the precursor layer to ultraviolet radiation to remove at least a portion of the porogen before exposing the precursor layer to the plasma comprising a reducing or oxidizing agent and a silanol capping agent provided therein.

3. The method of claim 1, wherein the dielectric matrix comprises silicon and oxygen.

4. The method of claim 1, wherein the dielectric matrix comprises silicon, oxygen, hydrogen and carbon.

5. The method of claim 1, wherein the dielectric matrix is derived from at least one of TEOS, MTEOS, DMDEOS, TMOS, MTMOS, DMDMOS, TMCTS, OMCTS, BTEOSE and BTEOSM.

6. The method of claim 1, wherein the porogen is an organic polymer.

7. The method of claim 1, wherein the precursor layer is formed by chemical vapor deposition, a print on process, dip casting, a spin on process, a spray on process or supercritical dielectric infusion in a polymer matrix.

8. The method of claim 1, wherein the silanol capping agent comprises one or more of a silane amine, a disilazane, a chlorosilane, an aldehyde, an alkylsiloxane and an alkyl alkoxysilane.

9. The method of claim 8, wherein the silanol capping agent comprises one or more of HMDS, DMDMOS, MTMOS, TMCTS, OMCTS, trimethylchlorosilane and acetaldehyde.

10. The method of claim 1, wherein the silanol capping agent is introduced to the plasma using a carrier gas.

11. The method of claim 1, wherein the silanol capping agent is introduced to the plasma without using a carrier gas.

12. The method of claim 1, wherein the plasma comprises a reducing gas.

13. The method of claim 12, wherein the reducing gas is formed from at least one of hydrogen, ammonia, carbon monoxide and methane.

14. The method of claim 1, wherein the plasma comprises an oxidizing gas.

15. The method of claim 14, wherein the oxidizing gas is formed from at least one of carbon dioxide, nitrous oxide and oxygen.

16. The method of claim 1, wherein the plasma further comprises at least one of nitrogen, argon and helium.

17. The method of claim 1, where a plasma source to generate the plasma has a power ranging between about 100 and about 2000 Watts.

18. The method of claim 1, a high or low frequency plasma source is used to generate the plasma.

19. The method of claim 1, wherein a combination of low and high frequency plasma source(s) is/are used to generate the plasma.

20. The method of claim 1, wherein the plasma is a downstream plasma.

21. The method of claim 1, wherein the substrate temperature during plasma exposure ranges between about 100 and about 400 degrees Celsius.

22. The method of claim 1, wherein the dosage of silanol capping agent provided in the plasma is between about 0.2 and about 20 ml/minute.

23. The method of claim 1, wherein the plasma is provided with a chamber pressure of between about 1 and about 10 Torr.

24. The method of claim 1, wherein the precursor layer is exposed to a plasma comprising a silanol capping agent for a time period ranging between about 5 seconds and 20 minutes.

25. A method of preparing a low-k dielectric material on a substrate, the method comprising;
   providing a precursor layer on said substrate, said layer comprising an organic porogen in a dielectric matrix;

exposing the precursor layer to a plasma to thereby remove said porogen from the precursor layer to create voids within the dielectric matrix; and after removing said organic porogen, exposing the dielectric matrix to a silanol capping agent, without first exposing the dielectric matrix to moisture or ambient conditions, wherein the the removal and capping operations are performed at different stations in a multistation tool.

26. The method of claim 25, after providing the precursor layer on the substrate further exposing the precursor layer to ultraviolet radiation to remove at least a portion of the porogen before exposing the precursor layer to the plasma comprising a silanol capping agent provided therein.

27. The method of claim 25, wherein the plasma comprises a reducing agent.

28. The method of claim 25, wherein the plasma is formed from a gas comprising one or more of hydrogen, a mixture of hydrogen and nitrogen, and ammonia.

29. The method of claim 25, wherein the silanol capping agent comprises one or more of a silane amine, a disilazane, a chlorosilane, an aldehyde, an alkylsiloxane and an alkyl alkoxysilane.

30. The method of claim 25, wherein the silanol capping agent comprises one or more of HMDS, DMDMOS, trimethylchlorosilane and acetaldehyde.

31. The method of claim 25, wherein exposing the dielectric matrix to a silanol capping agent includes providing the silanol capping agent in one of a vapor phase, liquid phase or supercritical phase.

32. The method of claim 25, wherein exposing the dielectric matrix to a silanol capping agent includes providing the silanol capping agent in a second plasma.

33. The method of claim 32, wherein the silanol capping agent is introduced to the second plasma using a carrier gas.

34. The method of claim 33, wherein the carrier gas comprises at least one of nitrogen, argon or helium.

35. The method of claim 33, wherein the carrier gas comprises at least one of a reducing gas and an oxidizing gas.

36. The method of claim 32, wherein the silanol capping agent is introduced to the second plasma without using a carrier gas.

37. The method of claim 32, wherein the dosage of silanol capping agent provided in the second plasma is between about 0.5 and about 2 ml/minute.

38. The method of claim 32, wherein exposing the dielectric matrix to a silanol capping agent occurs for a time period ranging between about 5 seconds and 20 minutes.

39. The method of claim 32, wherein exposing the dielectric matrix to a silanol capping agent includes using plasma power ranging between about 100 and 2000 Watts.

40. The method of claim 32, wherein exposing the dielectric matrix to a silanol capping agent includes using substrate temperature ranges between about 100 and 400 degrees Celsius.

41. The method of claim 32, wherein exposing the dielectric matrix to a silanol capping agent includes using a chamber pressure of between about 1 and about 10 Torr.

* * * * *